US012567867B2

(12) United States Patent
Harrell et al.

(10) Patent No.: US 12,567,867 B2
(45) Date of Patent: Mar. 3, 2026

(54) DIGITAL-TO-ANALOG CONVERTER GLITCH REDUCTION TECHNIQUES

(71) Applicant: Analog Devices International Unlimited Company, Limerick (IE)

(72) Inventors: Michael E. Harrell, Colorado Springs, CO (US); Alan Rizada Kilantang, General Trias (PH); Angel Rael, Colorado Springs, CO (US); Murat Demirkan, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 100 days.

(21) Appl. No.: 18/471,767

(22) Filed: Sep. 21, 2023

(65) Prior Publication Data

US 2024/0113721 A1 Apr. 4, 2024

Related U.S. Application Data

(60) Provisional application No. 63/377,214, filed on Sep. 27, 2022.

(51) Int. Cl.
| | |
|---|---|
| *H03M 1/06* | (2006.01) |
| *H03M 1/08* | (2006.01) |
| *H03M 1/12* | (2006.01) |

(52) U.S. Cl.
CPC ....... *H03M 1/0863* (2013.01); *H03M 1/0626* (2013.01); *H03M 1/1245* (2013.01)

(58) Field of Classification Search
CPC ............. H03M 1/0863; H03M 1/0626; H03M 1/1245

(Continued)

(56) References Cited

U.S. PATENT DOCUMENTS

| | | | |
|---|---|---|---|
| 5,646,620 A | * | 7/1997 | Regier ................ H03M 1/0872 341/118 |
| 6,304,199 B1 | * | 10/2001 | Fang ................... H03M 1/0624 341/118 |

(Continued)

FOREIGN PATENT DOCUMENTS

| | | |
|---|---|---|
| CN | 117792397 | 3/2024 |
| DE | 102023126164 | 3/2024 |

(Continued)

OTHER PUBLICATIONS

"Japanese Application Serial No. 2023-163146, Voluntary Amendment filed Oct. 11, 2023", 3 pgs.

(Continued)

*Primary Examiner* — Peguy Jean Pierre
(74) *Attorney, Agent, or Firm* — Schwegman Lundberg & Woessner, P.A.

(57) ABSTRACT

An electronic system includes a digital-to-analog converter (DAC) circuit to provide a drive signal to a second circuit that provides a system output, and a control circuit connected to an input of the DAC circuit. The control circuit is configured to receive a target signal at an input of the control circuit, provide a control circuit output to the input of the DAC circuit according to the target signal, detect when a transition of the DAC circuit results in a glitch signal at an output of the DAC circuit, and provide a compensation signal to the DAC circuit to reduce a magnitude of the glitch signal.

20 Claims, 8 Drawing Sheets

(58) Field of Classification Search
USPC ................................. 341/120, 144, 155, 118
See application file for complete search history.

(56) References Cited

U.S. PATENT DOCUMENTS

| | | | | |
|---|---|---|---|---|
| 11,018,681 B1 * | 5/2021 | Hamilton | ............ | H03M 1/0836 |
| 2024/0097690 A1 * | 3/2024 | Demirkan | ........... | H03M 1/0604 |

FOREIGN PATENT DOCUMENTS

| | | | |
|---|---|---|---|
| JP | 2000151403 A | 5/2000 | |
| JP | 2013131838 A | 7/2013 | |
| JP | 2022124126 A | 8/2022 | |

OTHER PUBLICATIONS

"Chinese Application Serial No. 202311260227.5, Voluntary Amendment filed Jul. 3, 2024", w/ English claims, 10 pgs.
"Japanese Application Serial No. 2013-163146, Notification of Reasons for Rejection mailed Oct. 28, 2025", W/O English Translation, 3 pgs.

* cited by examiner

800

DIGITAL-TO-ANALOG CONVERTER GLITCH REDUCTION TECHNIQUES

CLAIM FOR PRIORITY

This application claims priority to U.S. Provisional Application Ser. No. 63/377,214, filed Sep. 27, 2022, which is hereby incorporated by reference herein in its entirety.

BACKGROUND

Data converter systems used to generate signals in electronic circuits may present artifacts that result in a reduction in signal fidelity. One such artifact is a digital-to-analog converter (DAC) code glitch which results in a difference between the actual DAC output and an idealized DAC output. This DAC glitch causes both time and frequency domain variation from an idealized system output. In the frequency domain, these glitches may be coherent causing sideband signal energy or may be non-coherent causing an increase in phase and amplitude noise. In the time domain, these glitches may cause excess ripple or noise or, in a digital control loop, may present a source for accuracy error or even loop stability concerns.

SUMMARY OF THE DISCLOSURE

This document relates to electronic circuits that use DACs to generate signals. Compensation and correction methods are described that can be incorporated within either a controlling algorithm or within the DAC circuitry itself to mitigate the effects of DAC glitches in either open or closed looped systems.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Binary-weighted DACs are known to generate significantly higher glitches specifically during major carry code transitions. The glitches generated during major carry transitions could result in amplitudes exceeding several LSBs even though the glitches generated during any other code transitions are benign. In segmented DAC architectures, higher energy glitches could be generated during MSB segment transitions and could repeat periodically across the code space. Also, there could be high glitches observed during midscale code transition in the LSB sub-DACs of the segmented DACs.

Figure 1:
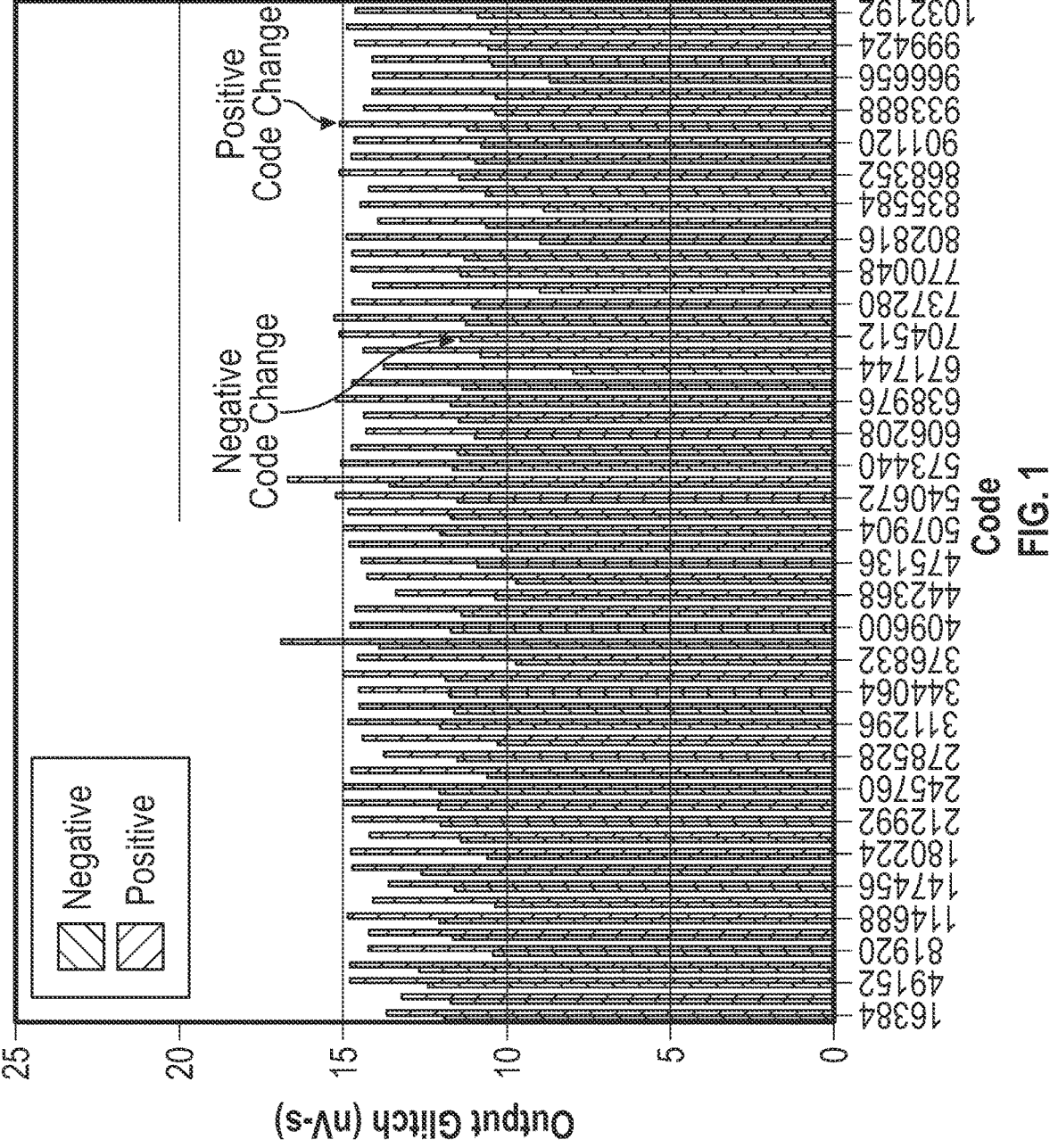
FIG. 1 is a graph of an example of output voltage glitch amplitude versus digital-to-analog converter (DAC) code changes for a segmented DAC.

FIG. 1 is a graph of an example of output voltage glitch amplitude versus DAC code changes for an 18-bit segmented DAC. In the example DAC of FIG. 1, there are 64 high-energy glitch spikes present across the code space that correspond to MSB segment code transitions. Glitches are generated when crossing certain code thresholds that are called "glitch thresholds" herein. The shape of the glitch can differ depending on the glitch threshold being crossed and the direction of crossing. These glitches may have significant effects depending on the system application.

Figure 2:
FIG. 2 is a block diagram of an electronic system with open loop control.
Figure 2:
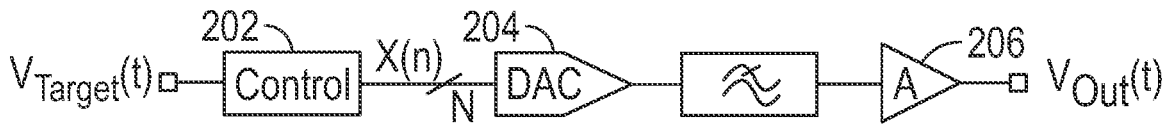

FIG. 2 is a block diagram of an electronic system 200 with open loop control. The electronic system 200 includes a control circuit 202, an amplifier circuit 206, and a DAC circuit 204 to provide a drive signal to the amplifier circuit 206. The control circuit 202 can include logic circuitry to perform the functions described. In some examples, the logic circuitry of the control circuit 202 can include processing circuitry such as a microprocessor or other processor performing instructions in software or firmware to perform the functions described. In variations, the logic circuitry of the control circuit can include a programmable gate array (PGA) or application specific integrated circuit (ASIC). The control circuit 202 receives a target $V_{TARGET}(t)$ and sets the input to the DAC circuit 204 to set the output $V_{OUT}(t)$ to the target. The target may be a digital signal. For instance, the control circuit 202 may provide an n-bit digital value to the DAC circuit 204.

Figure 3:
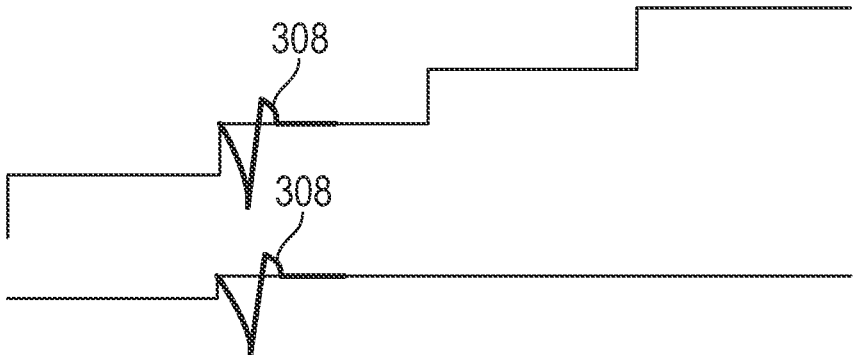
FIG. 3 is an illustration of examples of excess signal noise due to a DAC glitch at the output of the DAC.

FIG. 3 is an illustration of examples of excess signal noise due to a DAC glitch at the output of the DAC. In an open loop system such as the electronic system 200 of FIG. 2, a glitch 308 as in FIG. 3 may be benign but undesirable because it causes excess noise and a reduction in signal fidelity.

Figure 4:
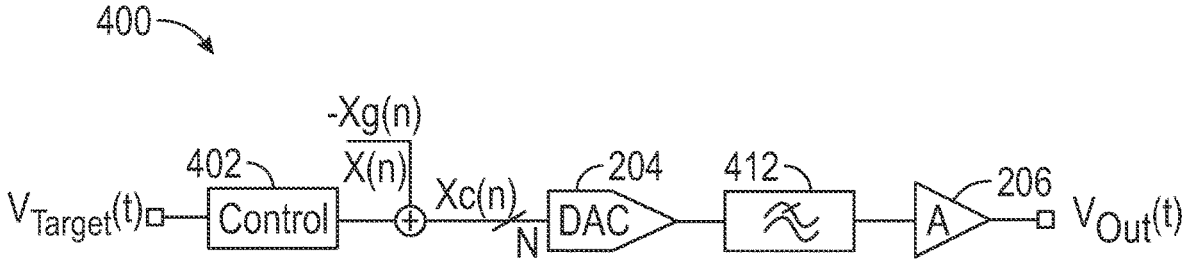
FIG. 4 is a block diagram of an example of an electronic system with open loop control and DAC glitch compensation.

FIG. 4 is a block diagram of an example of an electronic system 400 with open loop control and DAC glitch compensation. In the example of FIG. 4, the glitch is corrected or compensated by summing the compensation signal (−Xg (n)) and the output of the control circuit 402 using a summing circuit node at the output of the control circuit 402 and the input to the DAC circuit 204. The compensation signal may be a glitch-nulling signal in a digital form that is constructed to be approximately the same time average of the glitch signal but opposite in magnitude. The adding of the glitch compensation signal may be triggered by the control circuit 402 when the control circuit 402 detects a DAC transition (e.g., a X(n−1) to X(n) transition) that crosses the glitch threshold that generates the glitch. The magnitude and sign of the glitch compensation signal (−Xg (n)) may be pre-determined and/or periodically updated via a calibration process.

Figure 5:
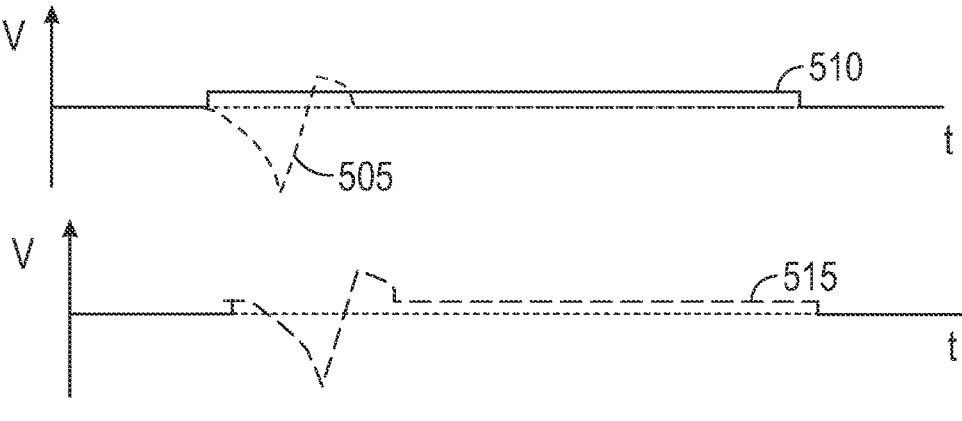
FIG. 5 shows waveforms illustrating a glitch mitigation process.

FIG. 5 shows waveforms illustrating a glitch mitigation process. Waveform 505 is a measured DAC glitch and waveform 510 is the compensating pulse in digital form. Summing these together in digital before the DAC circuit 204 results in waveform 515, which is a near zero, time average waveform at output of the DAC circuit 204 and the system output $V_{OUT}(t)$. The area of waveform 515 above the dotted line is equal to the area below the dotted line over the sample interval. The zero-to-peak error is also reduced but the peak-to-peak remains equivalent. FIG. 5 shows the glitch mitigation process applied to a single bit period. The glitch mitigation process can be extended and applied to multiple bit periods if the duration of the glitch artifact in the system extends over the multiple bit periods.

Figure 6:
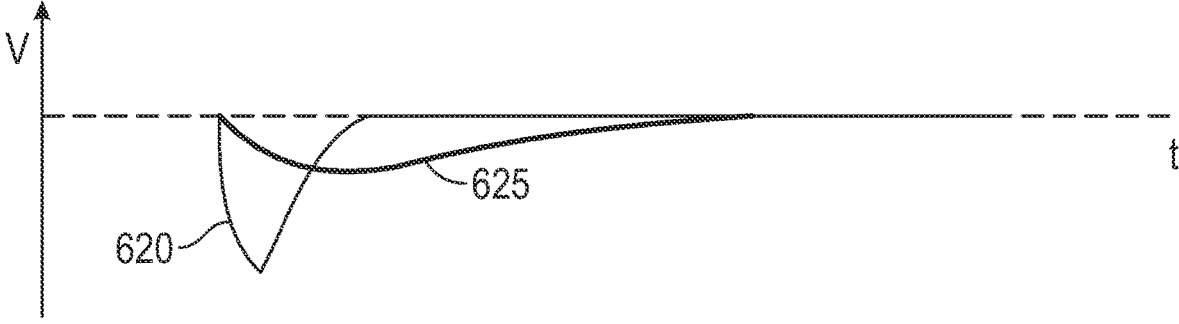
FIG. 6 are waveforms illustrating the effect of filtering the signaling of the DAC circuit.

FIG. 6 are waveforms illustrating the effect in FIG. 4 of filtering the signaling output from the DAC circuit 204 using filter circuit 412. Waveform 620 is the DAC glitch and waveform 625 is a signal artifact resulting from filtering the analog signal output of the DAC circuit 204. By adding filtering after the DAC, the effect in the analog signal output from the DAC is to reduce the amplitude of the glitch while increasing the duration of the signal artifact from the glitch. The area under the curve is approximately conserved in the two waveforms.

Figure 7:
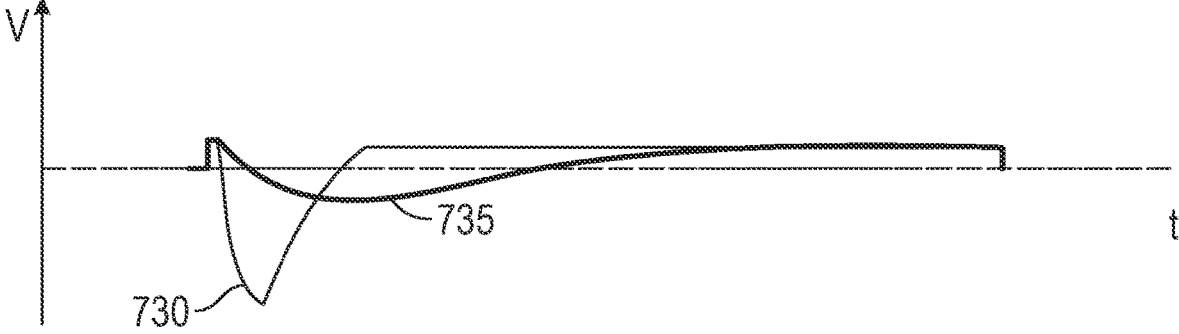
FIG. 7 shows waveforms illustrating the effect of applying a nulling compensation signal and the filtering to a DAC circuit.

FIG. 7 shows waveforms illustrating the effect of applying the compensation nulling signal (-Xg(n)) and the filtering to the DAC circuit 204. Waveform 730 is the DAC glitch and waveform 735 is a signal artifact resulting from the nulling signal and filtering. A similar amount of nulling signal (-Xg(n)) as in FIG. 5 will reduce the time-average of the compensated glitch to near zero while the total ripple at the output is reduced to 30% of the signal without compensation.

In the example of FIG. 4, the compensation (-Xg(n)) is added to the digital signal X(n) from the control block at the input to the DAC. In another example, the compensation is corrected transparently internal to the DAC itself instead of as an external compensation signal. The glitch from the DAC is compensated within the DAC by a digital signal when the DAC code makes a transition susceptible to glitches. In another example, the glitch from the DAC is compensated internally within the DAC analog core using a pulse shaped glitch-compensating analog signal.

Figure 8:
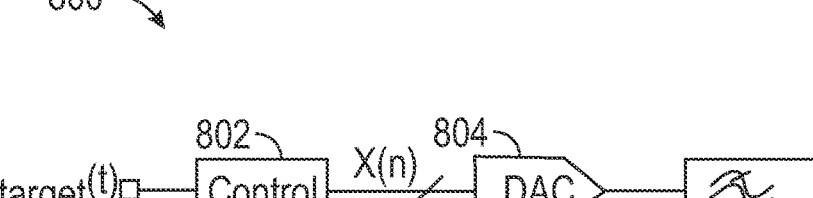
FIG. 8 is a block diagram of an electronic system with closed loop control.
Figure 9:
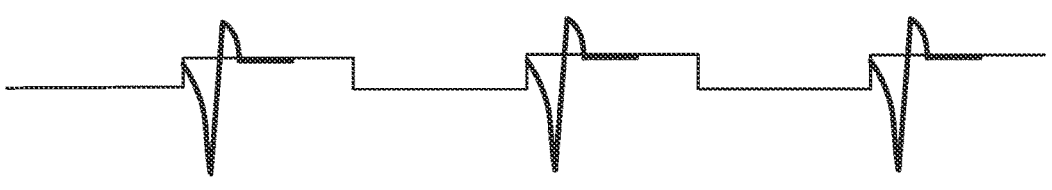
FIG. 9 is a graph showing a sustained system response with low-level oscillation or ripple.

FIG. 8 is a block diagram of an electronic system 800 with closed loop control that includes a DAC circuit 804. The closed loop circuit of FIG. 8 includes an analog-to-digital converter (ADC) circuit 814 to provide feedback regarding the system output. The control circuit 802 can adjust the DAC circuit 204 to better match the system output to the system target output. The effect of a DAC glitch in a closed loop system, such as FIG. 8, depends greatly on the dynamics of the digital loop control, the characteristics of the glitch and the system's frequency response to the glitch. The closed loop control of the electronic system 800 may be analyzed with a glitch noise source added at the output of the DAC circuit 804. Depending on the sign, magnitude, and frequency characteristics of the glitch it is possible that a sustained system response could set up a low-level oscillation or ripple as shown in FIG. 9. By using the glitch mitigation technique shown in FIGS. 5 and 7, the magnitude of the glitch can be reduced, and the sign of the glitch can be inverted to eliminate the possibility of oscillation. Multiple bit periods can be used to shape the resulting signal.

Figure 10:
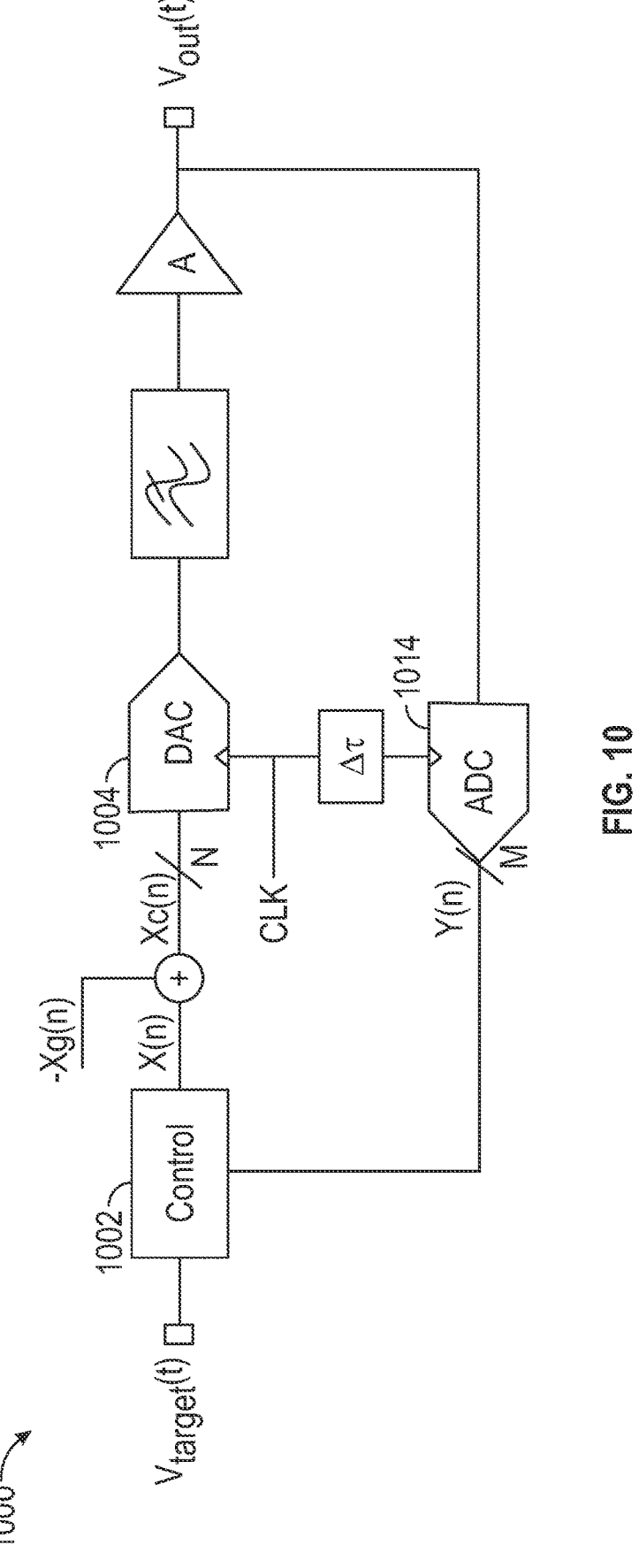
FIG. 10 is a block diagram of an electronic system with closed loop control and DAC glitch compensation.

FIG. 10 is an example of a closed loop system 1000 that includes DAC glitch compensation. The compensation in FIG. 10 adds a nulling signal (-Xg(n)) at the output of the control circuit 1002 and the input to the DAC circuit 1004.

The glitch compensation could be integrated into the control algorithm of the control circuit 1002 or the DAC core of the DAC circuit 1004. The glitch compensation reduces the forward path peak-to-peak noise and time-averaged error due to the DAC glitch. The glitch compensation improves the performance of the closed-loop control by increasing accuracy and reducing ripple at the output.

In the closed loop system of FIG. 10, the $\Delta\tau$ delay in the ADC clock (CLK) can be used as a means of calibration. The $\Delta\tau$ delay in the ADC clock may be used to shift the ADC clocking aperture to measure the glitch impulse response through the sampling aperture. Also, the timing of the ADC sampling can be adjusted to minimize the response of the closed loop system to the glitch energy at the output.

The closed loop system of FIG. 10 may also be used to calibrate the glitch compensation by first stepping across the range of DAC input values at a slower sampling rate where the glitch is settled out at the measurement time and recording the baseline samples from the ADC circuit 1014 that include all the linearity artifacts. The measurements are then repeated over the DAC input range while stepping across the desired glitch thresholds at the desired sampling rate and recording the glitch effect for the DAC inputs as the difference between the measured glitch response and the baseline response. The glitch compensation for a DAC transition can be a compensation pulse having the same time average value as the measured glitch for the DAC transition.

Figure 11:
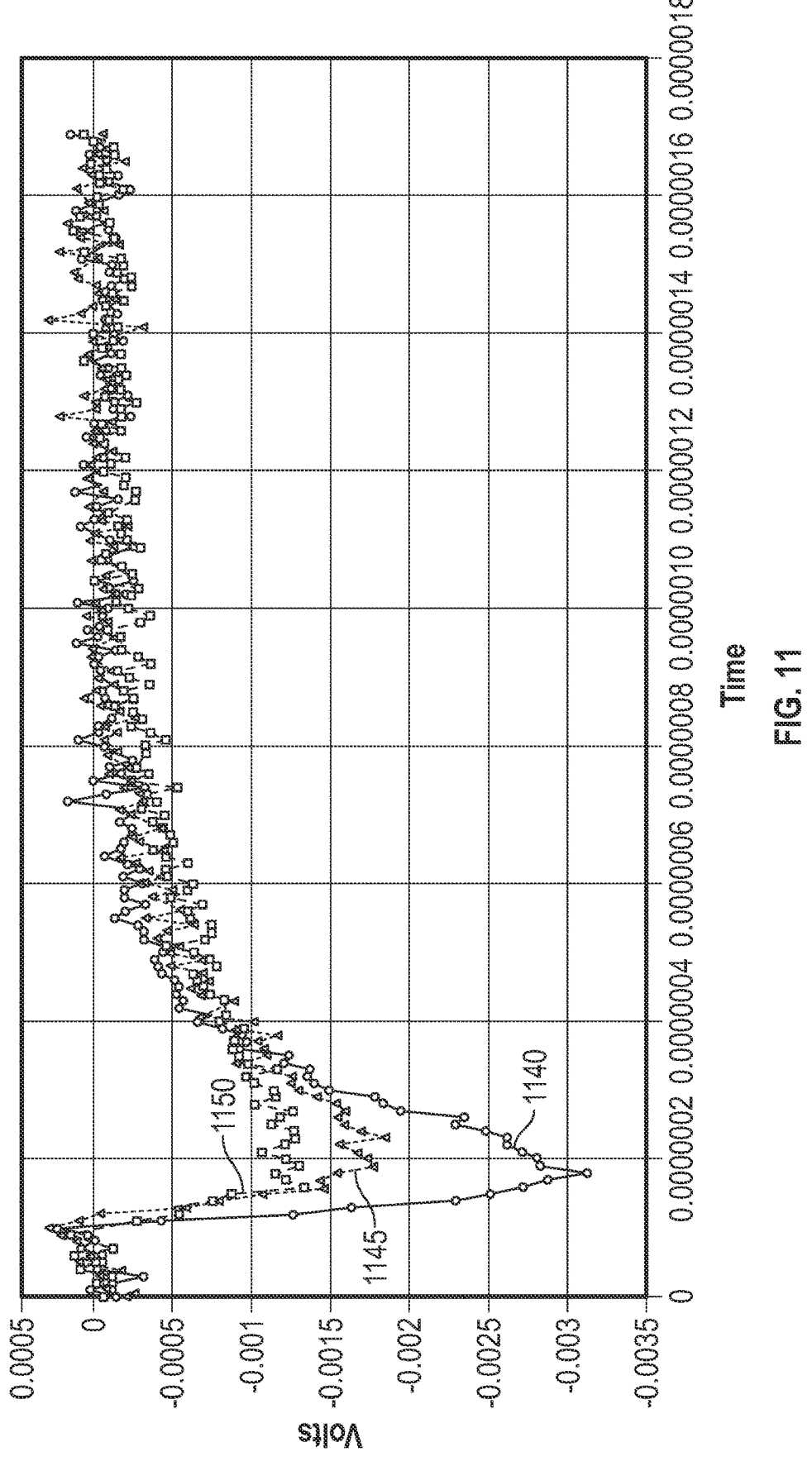
FIGS. 11 and 12 are graphs of measured data from a DAC showing results of the DAC glitch compensation techniques.
Figure 12:
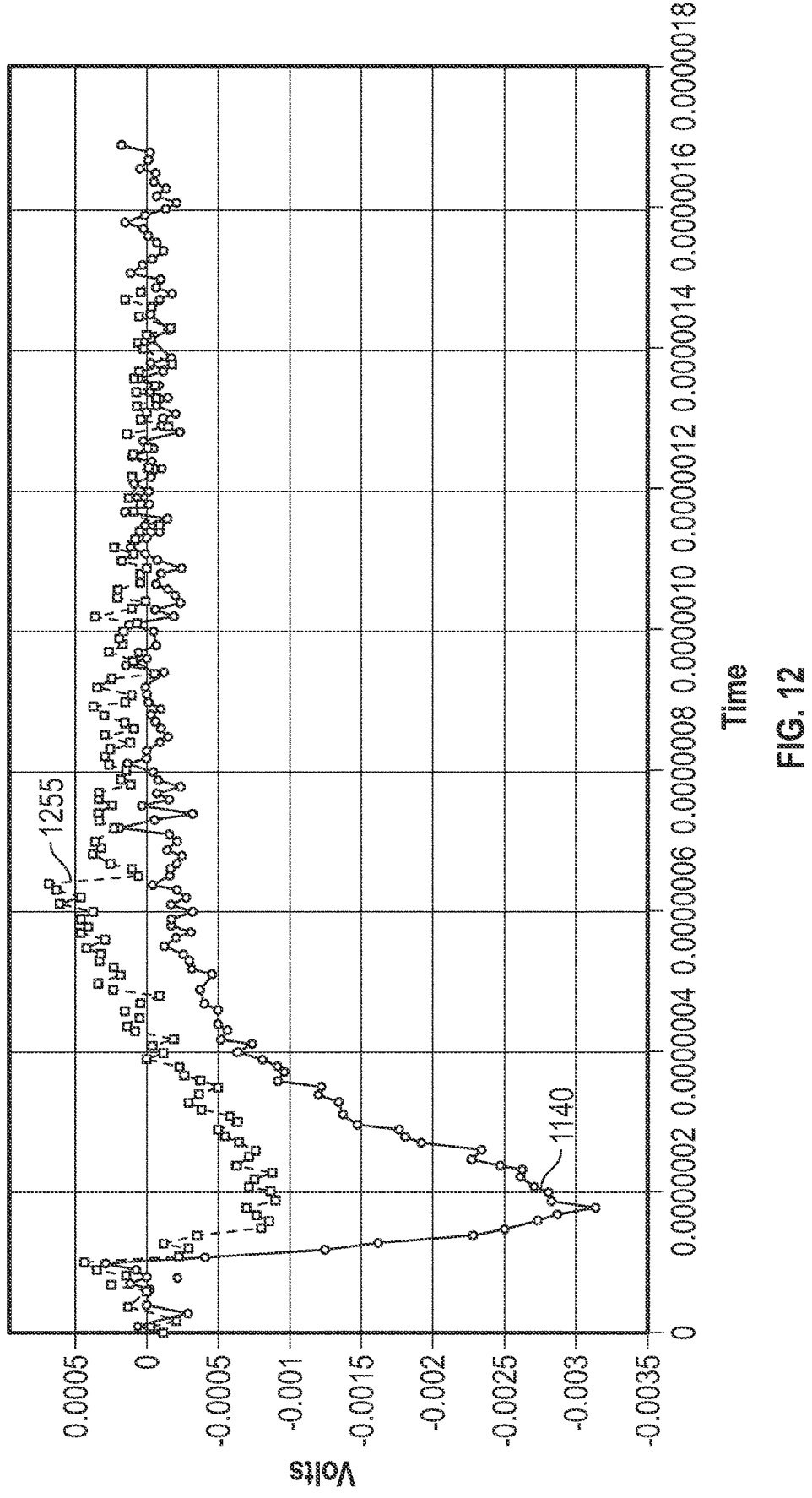

FIGS. 11 and 12 are graphs of measured data from a DAC showing the DAC glitch compensation techniques in practice. FIG. 11 shows a glitch before and after filtering, and FIG. 12 shows the effect of DAC glitch compensation triggered at a glitch threshold. FIG. 11 shows an original segmentation glitch in a DAC as the code transitions across a glitch threshold boundary. Trace 1140 is the original magnitude of the glitch. Traces 1145 and 1150 show the effect of filtering at the DAC output. The filtering for trace 1150 is increased from the filtering for trace 1145. The filtering traces (1145, 1150) show that the magnitude of the signal artifact from the glitch is reduced but the duration is increased.

FIG. 12 shows the combined effect of filtering and glitch compensation to reduce ripple resulting in over a 66% reducing in the glitch ripple and glitch compensation. Trace 1140 is the original magnitude of the glitch and trace 1255 shows the effect of filtering and glitch compensation. The traces show that the filtering and glitch compensation reduces the time-average signal artifact to nearly zero and reduces the duration of the glitch versus the filtering only approach.

The glitch mitigation techniques described herein allow DACs of a data converter system to settle at different DAC codes while maintaining a target output voltage or current while minimizing any reduction in signal fidelity due to signal glitching.

Additional Description and Examples

Example 1 includes subject matter (such as an electronic system) comprising at least one amplifier circuit to provide a system output, a digital-to-analog converter (DAC) circuit to provide a drive signal to the amplifier circuit, and a control circuit. The control circuit is configured to receive a target signal at an input of the control circuit and provide a control circuit output to the input of the DAC circuit according to the target signal, detect when a transition of the DAC circuit results in a glitch signal at an output of the DAC circuit, and provide a compensation signal to the DAC circuit to reduce a magnitude of the glitch signal.

In Example 2, the subject matter of Example 1 optionally includes a summing circuit node, and the compensation signal is summed with an output of the control circuit using the summing circuit node and the sum of the output of the control circuit and the compensation signal are applied to the input to the DAC circuit.

In Example 3, the subject matter of one or both of Examples 1 and 2 optionally includes a control circuit configured to provide a compensation pulse in digital form to the DAC circuit as the compensation signal.

In Example 4, the subject matter of one or any combination of Examples 1-3 optionally includes control circuit configured to provide a compensation pulse in analog form to an analog circuit internal to the DAC circuit as the compensation signal.

In Example 5, the subject matter of one or any combination of Examples 1~4 optionally includes a filter circuit coupled to the output of the DAC circuit and a control circuit configured to provide the compensation signal to the DAC circuit to produce a glitch-compensated analog signal at an output of the DAC circuit, and the filter circuit filters the glitch-compensated analog signal.

In Example 6, the subject matter of one or any combination of Examples 1-5 optionally includes an analog-to-digital converter (ADC) circuit connected to the system output, and a control circuit configured to adjust the control circuit output to reduce a difference between an output of the ADC circuit and the target sign.

In Example 7, the subject matter of Example 6 optionally includes an ADC circuit configured to sample the glitch signal to measure a glitch signal impulse response, and detect when a magnitude of the glitch signal impulse response exceeds a predetermined glitch threshold to detect that the transition of the DAC circuit results in the glitch signal.

In Example 8, the subject matter of one or any combination of Examples 1-7 optionally includes the DAC circuit being a binary-weighted DAC circuit.

Example 9 includes subject matter (such as a method of compensation for an electronic system to reduce signal artifacts) or can optionally be combined with one or any combination of Examples 1-8 to include such subject matter, comprising driving at least one amplifier circuit of the electronic system using a digital-to-analog converter (DAC) circuit to set a system output of the electronic system, detecting, using a control circuit, when a transition of the DAC circuit results in a glitch signal at an output of the DAC circuit, and adding a compensation signal to the DAC circuit to reduce a magnitude of the glitch signal.

In Example 10, the subject matter of Example 9 optionally includes adding the compensation signal at an output of the control circuit and an input to the DAC circuit.

In Example 11, the subject matter of one or both of Examples 9 and 10 optionally includes adding a compensation pulse in digital form to the DAC circuit.

In Example 12, the subject matter of one or any combination of Examples 9-11 optionally includes adding a compensation pulse in analog form internal to the DAC circuit.

In Example 13, the subject matter of one or any combination of Examples 9-12 optionally includes adding a compensation signal to the DAC circuit to produce a glitch-compensated analog signal at an output of the DAC circuit and filtering the glitch-compensated analog signal.

In Example 14, the subject matter of one or any combination of Examples 9-13 optionally includes applying the system output to an input of an analog-to-digital converter (ADC) circuit and providing the output of the ADC circuit to the control circuit, sampling the glitch signal using the ADC circuit to measure a glitch signal impulse response, and detecting when a magnitude of the glitch signal impulse response exceeds a predetermined glitch threshold.

In Example 15, the subject matter of one or any combination of Examples 9-14 optionally includes applying the system output to an input of an analog-to-digital converter (ADC) circuit and providing the output of the ADC circuit to the control circuit, changing the input to the DAC circuit over a range of DAC input values, sampling the ADC circuit output using a baseline sampling rate to determine DAC baseline responses for the range of DAC input values, changing the input to the DAC circuit over the range of DAC input values and sampling the ADC circuit output at a sampling rate higher than the baseline sampling rate to measure DAC glitch responses for the range of DAC input values, and recording glitch effects for the range of DAC input values as a difference between the measured DAC glitch responses and the DAC baseline responses.

In Example 16, the subject matter of Example 15 optionally includes detecting when the transition of the DAC circuit results in a glitch signal using a glitch effect recorded for the transition of the DAC circuit.

Example 17 includes subject matter (or can optionally be combined with one or any combination of Examples 1-16 to include such subject matter) such as a computer readable storage medium including instructions, that when performed by a processor of a control circuit of a data converter system, cause the control circuit to perform actions comprising receiving a target signal and setting an input to a digital-to-analog converter (DAC) circuit to set a system output of the data converter system according to the target signal, detecting when a transition of the DAC circuit results in a glitch signal at an output of the DAC circuit, and providing a compensation signal to the DAC circuit to reduce a magnitude of the glitch signal.

In Example 18, the subject matter of Example 17 optionally includes the computer readable storage medium including instructions to cause the control circuit to perform actions including producing a compensating pulse in digital form as the compensation signal.

In Example 19, the subject matter of one or both of Example 17 and 18 optionally includes the computer readable storage medium further including instructions to cause the control circuit to perform actions including receiving a digital value of the system output from an analog-to-digital converter (ADC) circuit of the data converter system, changing the input to the DAC circuit over a range of DAC input values, sampling the ADC circuit output using a baseline sampling rate to determine DAC baseline responses for the range of DAC input values, changing the input to the DAC circuit over the range of DAC input values and sampling the ADC circuit output at a sampling rate higher than the baseline sampling rate to measure DAC glitch responses for the range of DAC input values, and recording glitch effects for the range of DAC input values as a difference between the measured DAC glitch responses and the DAC baseline responses.

In Example 20, the subject matter of Example 19 optionally includes the computer readable storage medium further including instructions to cause the control circuit to perform actions including producing a compensating pulse in digital form as the compensation signal in response to detecting the transition of the DAC circuit that results in a glitch signal, and the compensating pulse has an average time value of the glitch effect recorded for the transition of the DAC circuit.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

What is claimed is:

1. An electronic system comprising:
a digital-to-analog converter (DAC) circuit to provide a drive signal to a second circuit, wherein the second circuit provides a system output; and
a control circuit connected to an input of the DAC circuit and configured to:
receive a target signal at an input of the control circuit and provide a control circuit output to the input of the DAC circuit according to the target signal;
detect when a transition of the DAC circuit results in a glitch signal at an output of the DAC circuit; and
provide a compensation signal to the DAC circuit to reduce a magnitude of the glitch signal, wherein a time average of the compensation signal depends on the magnitude of the glitch signal.

2. The electronic system of claim 1, including:
a summing circuit node; and
wherein the compensation signal is summed with an output of the control circuit using the summing circuit node and the sum of the output of the control circuit and the compensation signal are applied to the input to the DAC circuit.

3. The electronic system of claim 1, wherein the control circuit is configured to provide a compensation pulse in digital form to the DAC circuit as the compensation signal.

4. The electronic system of claim 1, wherein the control circuit is configured to provide a compensation pulse in analog form to an analog circuit internal to the DAC circuit as the compensation signal.

5. The electronic system of claim 1, including:
a filter circuit coupled to the output of the DAC circuit;
wherein the control circuit is configured to provide the compensation signal to the DAC circuit to produce a glitch-compensated analog signal at an output of the DAC circuit; and
wherein the filter circuit filters the glitch-compensated analog signal.

6. The electronic system of claim 1, including:
an analog-to-digital converter (ADC) circuit connected to the system output; and
wherein the control circuit is configured to adjust the control circuit output to reduce a difference between an output of the ADC circuit and the target signal.

7. The electronic system of claim 6, wherein the ADC circuit is configured to:
sample the glitch signal to measure a glitch signal impulse response; and
detect when a magnitude of the glitch signal impulse response exceeds a predetermined glitch threshold to detect that the transition of the DAC circuit results in the glitch signal.

8. The electronic system of claim 1, wherein the DAC circuit is a binary-weighted DAC circuit.

9. A method of compensation for an electronic system to reduce signal artifacts, the method comprising:
setting an input of a digital-to-analog converter (DAC) circuit to set a system output of the electronic system;
detecting, using a control circuit, when a transition of the DAC circuit results in a glitch signal at an output of the DAC circuit; and
adding a compensation signal to the DAC circuit to reduce a magnitude of the glitch signal, wherein a time average of the compensation signal depends on the magnitude of the glitch signal.

10. The method of claim 9, wherein adding the compensation signal includes adding the compensation signal at an output of the control circuit and an input to the DAC circuit.

11. The method of claim 9, wherein adding the compensation signal includes adding a compensation pulse in digital form to the DAC circuit.

12. The method of claim 9, wherein adding the compensation signal includes adding a compensation pulse in analog form internal to the DAC circuit.

13. The method of claim 9, including:
adding a compensation signal to the DAC circuit to produce a glitch-compensated analog signal at an output of the DAC circuit; and
filtering the glitch-compensated analog signal.

14. The method of claim 9, including:
applying the system output to an input of an analog-to-digital converter (ADC) circuit and providing the output of the ADC circuit to the control circuit;
sampling the glitch signal using the ADC circuit to measure a glitch signal impulse response; and
wherein the detecting when the transition of the DAC circuit results in the glitch signal includes detecting when a magnitude of the glitch signal impulse response exceeds a predetermined glitch threshold.

15. The method of claim 9, including:
applying the system output to an input of an analog-to-digital converter (ADC) circuit and providing the output of the ADC circuit to the control circuit;
changing the input to the DAC circuit over a range of DAC input values;

sampling the ADC circuit output using a baseline sampling rate to determine DAC baseline responses for the range of DAC input values;

changing the input to the DAC circuit over the range of DAC input values and sampling the ADC circuit output at a sampling rate higher than the baseline sampling rate to measure DAC glitch responses for the range of DAC input values; and recording glitch effects for the range of DAC input values as a difference between the measured DAC glitch responses and the DAC baseline responses.

16. The method of claim 15, including detecting when the transition of the DAC circuit results in a glitch signal using a glitch effect recorded for the transition of the DAC circuit.

17. A non-transitory computer readable storage medium including instructions, that when performed by a processor of a control circuit of a data converter system, cause the control circuit to perform actions comprising:

receiving a target signal and setting an input to a digital-to-analog converter (DAC) circuit to set a system output of the data converter system according to the target signal;

detecting when a transition of the DAC circuit results in a glitch signal at an output of the DAC circuit; and providing a compensation signal to the DAC circuit to reduce a magnitude of the glitch signal, wherein a time average of the compensation signal depends on the magnitude of the glitch signal.

18. The non-transitory computer readable storage medium of claim 17, including instructions that cause the control circuit to perform actions including producing a compensating pulse in digital form as the compensation signal.

19. The non-transitory computer readable storage medium of claim 17, including instructions that cause the control circuit to perform actions including:

receiving a digital value of the system output from an analog-to-digital converter (ADC) circuit of the data converter system;

changing the input to the DAC circuit over a range of DAC input values;

sampling the ADC circuit output using a baseline sampling rate to determine DAC baseline responses for the range of DAC input values;

changing the input to the DAC circuit over the range of DAC input values and sampling the ADC circuit output at a sampling rate higher than the baseline sampling rate to measure DAC glitch responses for the range of DAC input values; and recording glitch effects for the range of DAC input values as a difference between the measured DAC glitch responses and the DAC baseline responses.

20. The non-transitory computer readable storage medium of claim 19, including instructions that cause the control circuit to perform actions including:

producing a compensating pulse in digital form as the compensation signal in response to detecting the transition of the DAC circuit that results in a glitch signal; and wherein the compensating pulse has an average time value of the glitch effect recorded for the transition of the DAC circuit.

* * * * *